(12) United States Patent
Grivna (10) Patent No.: US 9,627,306 B2
(45) Date of Patent: Apr. 18, 2017

(54) BALL GRID STRUCTURE

(75) Inventor: Edward L. Grivna, Brooklyn Park, MN (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 902 days.

(21) Appl. No.: 13/427,845

(22) Filed: Mar. 22, 2012

(65) Prior Publication Data

US 2013/0211776 A1   Aug. 15, 2013

Related U.S. Application Data

(60) Provisional application No. 61/599,263, filed on Feb. 15, 2012.

(51) Int. Cl.
| G06F 17/50 | (2006.01) |
| H01L 23/498 | (2006.01) |
| H01L 23/31 | (2006.01) |
| H05K 1/11 | (2006.01) |
| H05K 3/00 | (2006.01) |

(52) U.S. Cl.
CPC .. *H01L 23/49816* (2013.01); *H01L 23/49838* (2013.01); *H01L 23/3114* (2013.01); *H01L 2924/0002* (2013.01); *H05K 1/111* (2013.01); *H05K 3/0005* (2013.01); *H05K 2201/09418* (2013.01)

(58) Field of Classification Search
CPC ............. H01L 2924/00; H01L 23/3114; H01L 23/49816
USPC ........................................................ 716/122
See application file for complete search history.

(56) References Cited

U.S. PATENT DOCUMENTS

| 5,445,306 | A | | 8/1995 | Huddleston |
| 5,818,114 | A | | 10/1998 | Pendse et al. |
| 6,154,863 | A | * | 11/2000 | Prokopp ........................ 714/724 |
| 6,381,553 | B1 | * | 4/2002 | Yu .................................. 702/150 |
| 6,919,635 | B2 | | 7/2005 | Kawasaki et al. |
| 7,122,748 | B2 | | 10/2006 | Yamada |
| 7,129,574 | B2 | * | 10/2006 | Wu ................................ 257/691 |
| 7,640,523 | B1 | * | 12/2009 | Shi et al. ....................... 716/119 |

(Continued)

FOREIGN PATENT DOCUMENTS

| CN | 1564937 A | 1/2005 |
| CN | 101944697 A | 1/2011 |

(Continued)

OTHER PUBLICATIONS

M. Brunnbauer, T. Meyer, G. Ofner, K. Mueller and R. Hagen_ Embedded Wafer Level Ball Grid Array_Dated 2008_6 pages.

(Continued)

*Primary Examiner* — Suchin Parihar (57) ABSTRACT

An apparatus includes a contact grid array disposed on a substrate in a non-orthogonal row-column format with connection elements arranged in a hexagonal configuration. The contact grid array has an orientation based, at least in part, on an area available for the contact grid array on the substrate. A method to determine the orientation of the contact grid array includes identifying the area available for a contact grid array on a substrate and determining the orientation for the contact grid array based, at least in part, on the area available for the contact grid array on the substrate.

20 Claims, 7 Drawing Sheets

(56) References Cited

U.S. PATENT DOCUMENTS

| | | | |
|---|---|---|---|
| 7,666,778 B2 | 2/2010 | Young | |
| 7,687,803 B2 | 3/2010 | Takagi et al. | |
| 8,174,841 B2* | 5/2012 | Chang et al. | 361/772 |
| 2003/0183419 A1* | 10/2003 | Miller et al. | 174/261 |
| 2005/0181544 A1* | 8/2005 | Haba et al. | 438/127 |
| 2006/0110848 A1* | 5/2006 | Brown | 438/106 |
| 2008/0143379 A1* | 6/2008 | Norman | 326/39 |
| 2008/0185705 A1* | 8/2008 | Osborn et al. | 257/690 |
| 2008/0290481 A1* | 11/2008 | Kudoh et al. | 257/670 |
| 2010/0270676 A1* | 10/2010 | Chang et al. | 257/773 |
| 2011/0168433 A1* | 7/2011 | Kusaka | 174/255 |
| 2014/0024231 A1* | 1/2014 | An et al. | 439/68 |
| 2014/0153172 A1* | 6/2014 | Brist | 361/679.02 |
| 2015/0028478 A1* | 1/2015 | Meyer et al. | 257/738 |

FOREIGN PATENT DOCUMENTS

| | | |
|---|---|---|
| KR | 20000074091 A | 12/2000 |
| TW | 449892 | 8/2001 |

OTHER PUBLICATIONS

Ming-chuan Han, Bei-yue Yan, J.Z. Yao, Tu Anh Tran, Stephen Lee and Jun Li_Low K CMOS65 Ball Grid Array 47 um Pitch Wire Bonding Process Development_Dated 2007_5 pages.
Search Report for U.S. Appl. No. 13/427,845, Dated Mar. 2012, 10 pages.
SIPO Office Action for Application No. 201210325448.1 dated Jul. 31, 2015; 5 pages.
SIPO Office Action for Application No. 201210325448.1 dated Nov. 25, 2015; 3 pages.

\* cited by examiner

Figure 3D — BALLS IN TWO CORNERS IN SAME COLUMN

Figure 3C — BALLS IN TWO OPPOSITE CORNERS

Figure 3E — BALLS IN TWO CORNERS IN SAME ROW

Figure 5

BALL GRID STRUCTURE

RELATED APPLICATIONS

This application claims priority to U.S. Provisional Patent Application No. 61/599,263, filed Feb. 15, 2012, which is incorporated by reference herein.

TECHNICAL FIELD

This disclosure relates generally to electronic systems, and, more particularly, to ball grid arrays in the electronic systems.

BACKGROUND

Many integrated circuits include a package, such as a ball grid array, to provide an electrical interface between the integrated circuits and other external electronics, such as a circuit board. Unlike integrated circuit packages that provide connections along the perimeter of the package, such as dual-in-line (DIP), small outline IC (SOIC), or plastic leaded chip carrier (PLCC), ball grid arrays provide a high signal count in a small area to reduce the size of a packaged device and the board area consumed when mounted to a circuit board. A typical ball grid array can include multiple solder balls or bumps arranged in an orthogonal row-column format, with solder balls in a common row or a common column having a preset pitch or spacing between each other. The pitch or spacing between the solder balls can be utilized for routing traces from the solder balls to interface pads of the integrated circuits or to other devices on the circuit board.

For standard ball grid array packages, a number of solder balls in the ball grid array can be modified in order to accommodate modification in a number of signals entering or exiting the integrated circuits. As a number of solder balls increases, the ball grid array packages can increase in size or a pitch between the solder balls can be reduced. An increase in package size can increase cost, while the reduction in the pitch between the solder balls can be rendered impossible or impractical by introducing difficulties in the routing of traces or coupling the integrated circuit package to the circuit board.

A specialized form of a ball grid array, called a wafer-level chip scale package (WLCSP), can use a semiconductor die, for example, made of silicon or other semiconductor base material, such as sapphire, silicon carbide, gallium arsenide, as a package substrate to provide a small mounted footprint. Modifications to a size of the WLCSP, for example, increasing a package size to accommodate additional signals, directly corresponds to an increase in the semiconductor die size itself, which can work against a goal of reducing a mounted footprint.

The semiconductor die for WLCSP packaged devices often can be difficult or not economical to produce in form factors matching those of standard packages or ball grid spacings. Specific structures, such as the repeated cell dimensions of static random access memories (SRAMs), flash memories, dynamic random access memories (DRAMs), etc, are often highly asymmetrical when replicated millions of times on a device. As such, placement of a grid of orthogonally spaced solder balls may become difficult to impossible given the constraints of signal count and ball pitch. Also, in devices where it was originally possible to place a standard orthogonal grid, an optical shrink of a masking process, often used to improve manufacturing efficiencies of semiconductors, may yield a new die where a standard grid may no longer be usable.

DETAILED DESCRIPTION

An electronic system can include a ball grid array disposed on a substrate in a non-orthogonal row-column format with connection balls arranged in a triangular configuration. The ball grid array can have an orientation based, at least in part, on an area available for the ball grid array on the substrate. For example, the orientation of the ball grid array can include an arrangement of connection balls on edges of the area available for the ball grid array on the substrate based, at least in part, on both dimensions of the area available for the ball grid array on the substrate and a number of connection balls in the ball grid array. The triangular configuration of connection balls can allow for rows and columns to have a spacing that is different than a pitch between the connection balls. Embodiments are shown and described below in greater detail.

Figure 1A:
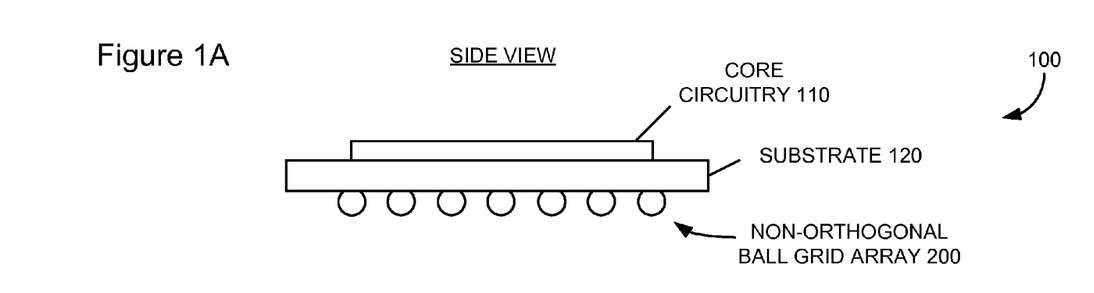
FIGS. 1A-1B are block diagram examples of an electronic system including a non-orthogonal ball grid array.
Figure 1B:
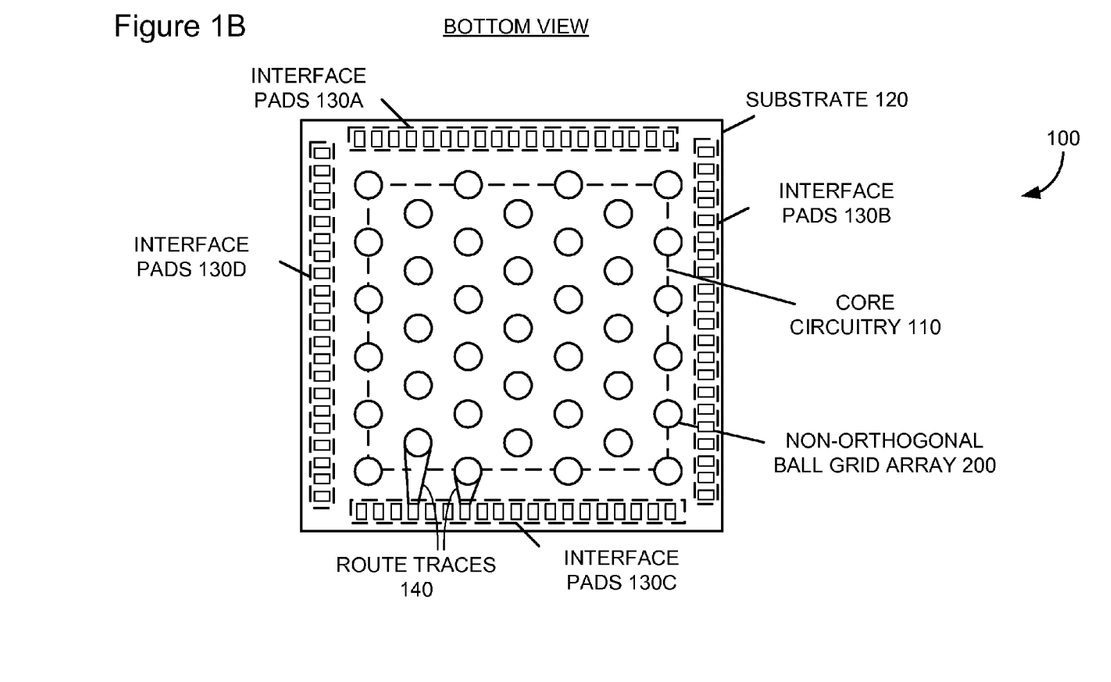

FIGS. 1A-1B are block diagram examples of an electronic system 100 including a non-orthogonal ball grid array 200. Referring to FIGS. 1A and 1B, the electronic system 100 can include core circuitry 110 disposed on or integrated with a substrate 120. In some embodiments, the substrate 120 can be a die or semiconductor chip that includes core circuitry 110, while, in other embodiments, the substrate 120 can be a printed circuit board 120 coupled to a die integrated with the core circuitry 110.

The electronic system 100 can include a non-orthogonal ball grid array 200 disposed on the substrate 120, for example, on the opposite side of the substrate 120 as the core circuitry 110. Although the non-orthogonal ball grid array 200 is shown in FIGS. 1A and 1B as being disposed on the opposite side of the substrate 120 as the core circuitry 110, the non-non-orthogonal ball grid array 200 can be disposed on the same side of the substrate 120 as the core circuitry. The non-orthogonal ball grid array 200 can include multiple connection elements, such as connection balls, bumps, pins, pads, connectors, or other electrical contacts, arranged in a triangular configuration. The non-orthogonal ball grid array 200 can be a ball grid array, a land grid array, a flip chip, or other electrical connector capable of interconnecting electrical devices. As will be discussed below in greater detail, this triangular configuration can allow the non-orthogonal ball grid array 200 to have a greater connection ball density than a conventional orthogonal row-column ball grid array.

The multiple connection balls can be comprised of solder or another conductive material, which can be coupled to other electronics external to the electronic system 100, such as a printed circuit board, silicon interposer, or other electronic interface device. The non-orthogonal ball grid array 200 can be implemented in a packaged ball grid array, a chip scale packaging (CSP) ball grid array, a wafer level chip scale packaging (WLCSP) ball grid array, or the like.

The substrate 120 can include groups of interface pads 130A-130D to couple with the connection balls via conductive route traces 140. In some embodiments, each connection ball can have a corresponding route trace 140 to a pad within the groups of interface pads 130A-130D. The route traces 140 can be at least one of a signaling trace to communicate signals with the core circuitry 110, a power trace to carry power for the core circuitry 110, or a ground trace to act as a ground for the core circuitry 110. The non-orthogonal ball grid array 200 can be arranged to space adjacent connection balls apart from each other by a predetermined distance, known as a ball pitch, to allow the route traces 140 to reach a corresponding pad within interface pads 130A-130D.

Figure 2:
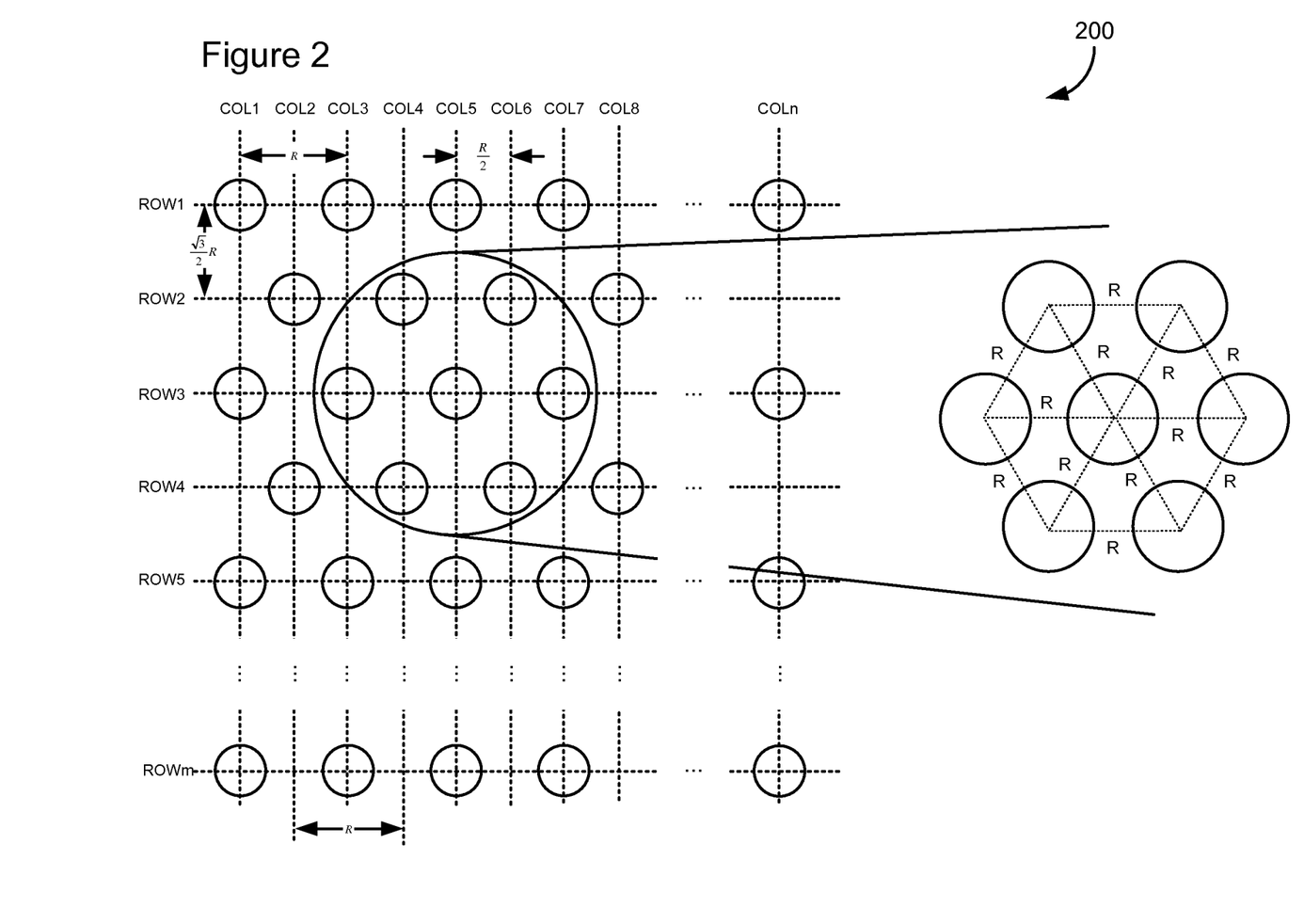
FIG. 2 is a block diagram example of the non-orthogonal ball grid array shown in FIG. 1.

FIG. 2 is a block diagram example of the non-orthogonal ball grid array 200 shown in FIG. 1. Referring to FIG. 2, the non-orthogonal ball grid array 200 can be arranged in a hexagonal configuration including multiple adjacent equilateral triangles, with each connection ball being the predetermined distance R from six adjacent connection balls, for example, each separated by an approximately 60 degree angle around the center connection ball. In turn, each of the adjacent connection balls can be separated by the predetermined distance from two adjacent connection balls.

The triangular configuration of the non-orthogonal ball grid array 200 can allow the non-orthogonal ball grid array 200 to have columns COL1-COLn, which are spaced apart at approximately one-half of the predetermined ball pitch R along one axis. The columns can be divided into odd columns, such as columns COL1, COL3, COL5, etc., and even columns, such as columns COL2, COL4, COL6, etc. The spacing between adjacent even columns and between adjacent odd columns can be equal to the predetermined ball pitch.

The triangular configuration of the non-orthogonal ball grid array 200 can allow the non-orthogonal ball grid array 200 to have rows ROW1-ROWm, which are spaced apart at approximately $$\frac{\sqrt{3}}{2}R,$$

where R can be the predetermined ball pitch. The rows can be divided into odd columns, such as columns ROW1, ROW3, ROW5, etc., and even columns, such as columns ROW2, ROW4, ROW6, etc. The spacing between adjacent even rows and between adjacent odd rows can be equal to $\sqrt{3}$ times the predetermined ball pitch.

In some embodiments, for example, when the non-orthogonal ball grid array 200 is rotated 90 degrees, the rows can have the spacing of the columns shown in FIG. 2 and the columns can have the spacing of the rows shown in FIG. 2. Since a distance between the rows can be different than a distance between the columns, which can also vary based on an orientation of the non-orthogonal ball grid array 200, such as a 90 degree rotation, selecting an orientation for the non-orthogonal ball grid array 200 can be based on the area (and dimensions) available on the substrate for placement of connection balls, and the number of balls for connections to signals.

Since the columns and rows of the non-orthogonal ball grid array 200 can grow with additional columns or rows or shrink with the removal of columns or rows at different lengths, by rotating the non-orthogonal ball grid array 200, the non-orthogonal ball grid array 200 can increase a number of connection balls that may be placed on a particular area of the substrate. For example, when a substrate has a usable area with a vertical dimension that is 5 times the ball pitch, up to 6 rows of connection balls can be fit in the area. If, however, the non-orthogonal ball grid array 200 is rotated by 90 degrees, allowing the columns shown in FIG. 2 to become rows in the rotated version of the non-orthogonal ball grid array 200, the rotated version of the non-orthogonal ball grid array 200 can include 11 rows of connection balls into this same vertical space. The rotational orientation of the non-orthogonal ball grid array 200 can be based on the area available for the ball grid array to be disposed on the substrate.

Figure 3A:
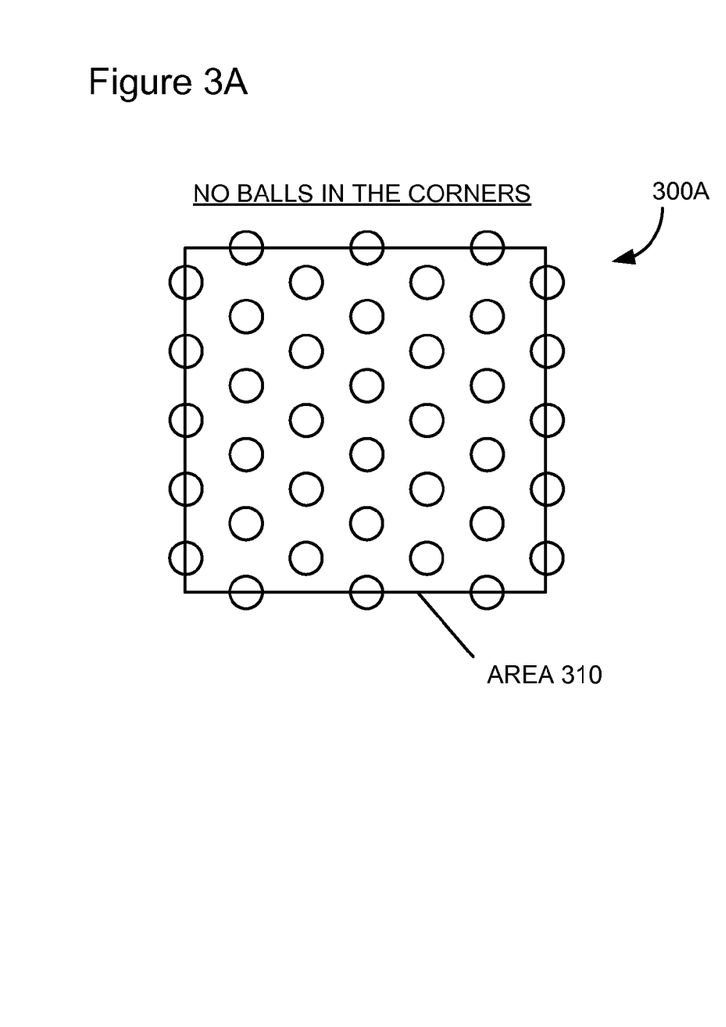
FIGS. 3A-3E are block diagram examples of various configurations for the non-orthogonal ball grid array shown in FIG. 1.

FIGS. 3A-3E are block diagram examples of various configurations for the non-orthogonal ball grid array 200 shown in FIG. 1. Referring to FIG. 3A, a non-orthogonal ball grid array 300A can include 38 connection balls within an area 310 available for placement of the non-orthogonal ball grid array 300A. Since the further away from a center of the area 310 that connection balls of the non-orthogonal ball grid array 300A are placed, the more stress can be exerted on the connection balls, the non-orthogonal ball grid array 300A can be configured with an edge orientation having no connection balls in corners of the area 310 available for placement of the non-orthogonal ball grid array 300A. These corner connection balls can be the most prone to incurring damage during the manufacturing and assembly processes, such that their absence can provide a more reliable and higher yielding manufacturing process.

Figure 3B:
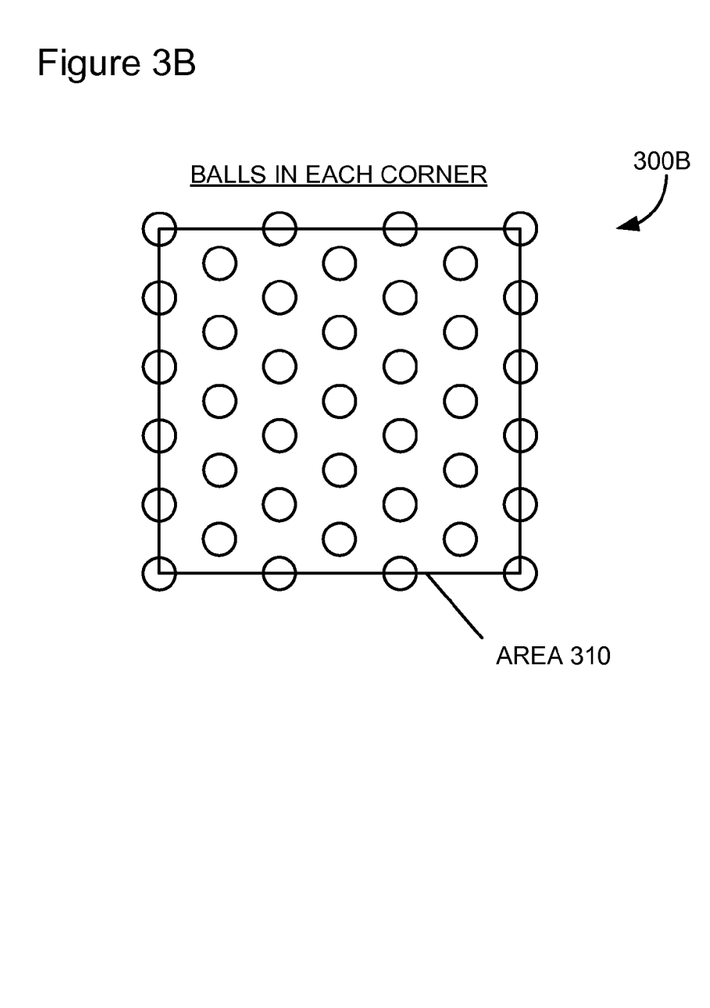

Referring to FIG. 3B, a non-orthogonal ball grid array 300B can include 39 connection balls within an area 310 available for placement of the non-orthogonal ball grid array 300B. By altering the edge orientation of the non-orthogonal ball grid array 300B, for example, by replacing a 5 connection ball column with a 6 connection ball column, the non-orthogonal ball grid array 300B can include an extra connection ball within the same area 310 as FIG. 3A without having to adjust the ball pitch. The non-orthogonal ball grid array 300B can be configured with an edge orientation having connection balls in each of the corners of the area 310 available for placement of the non-orthogonal ball grid array 300A. The selection between the non-orthogonal ball grid array 300A and the non-orthogonal ball grid array 300B can be based on the dimensions of the area 310, a number of connection balls to be placed on in the area 310, the potential for stress exerted on connection balls, and the maturity and stability of the manufacturing environment used to assemble the device to a mating circuit.

Figure 3C:
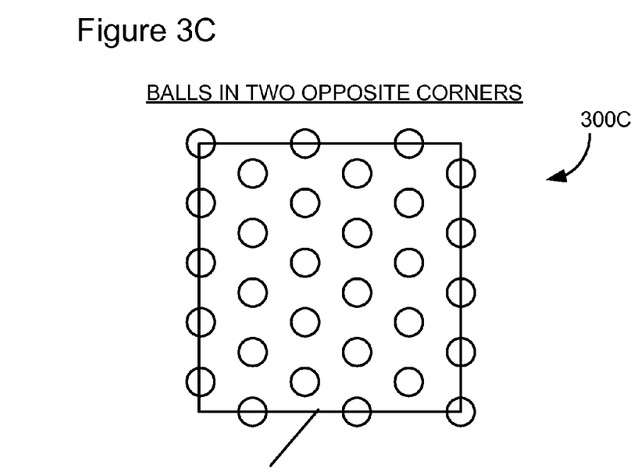

Referring to FIG. 3C, a non-orthogonal ball grid array 300C can include 30 connection balls within an area 320 available for placement of the non-orthogonal ball grid array 300C. The non-orthogonal ball grid array 300C can be configured with an edge orientation having two connection balls in opposite corners of the area 320 available for placement of the non-orthogonal ball grid array 300C. A selection of this edge orientation can be made based on the dimensions of the area 320 and a number of connection balls to be placed in the area 320. In some embodiments, a selection of which corners are populated with connections balls in this edge configuration can be based on a placement of routing traces between the connection balls, and/or any electrical interference that those routing traces may experience over portions of the area 320.

Figure 3D:
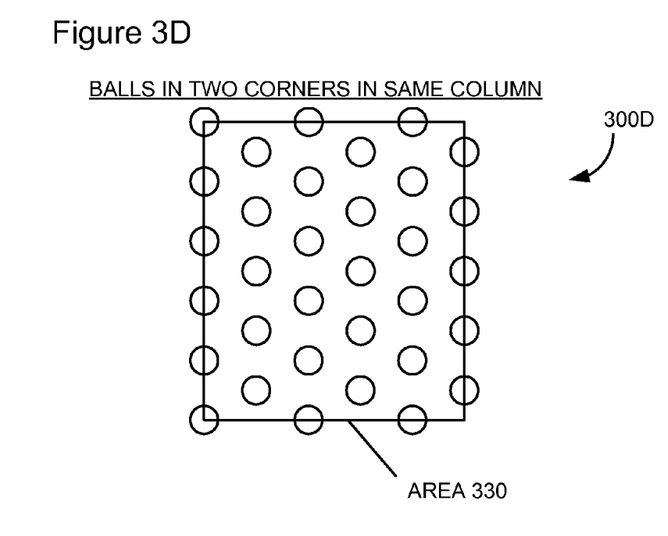

Referring to FIG. 3D, a non-orthogonal ball grid array 300D can include 33 connection balls within an area 330 available for placement of the non-orthogonal ball grid array 300D. The non-orthogonal ball grid array 300D can be configured with an edge orientation having two connection balls in corners of a common column. A selection of this edge orientation can be made based on the dimensions of the area 330 and a number of connection balls to be placed in the area 330. In some embodiments, a selection of which corners are populated with connections balls in this edge configuration can be based on a placement of routing traces between the connection balls, and/or any electrical interference that those routing traces may experience over portions of the area 330.

Figure 3E:
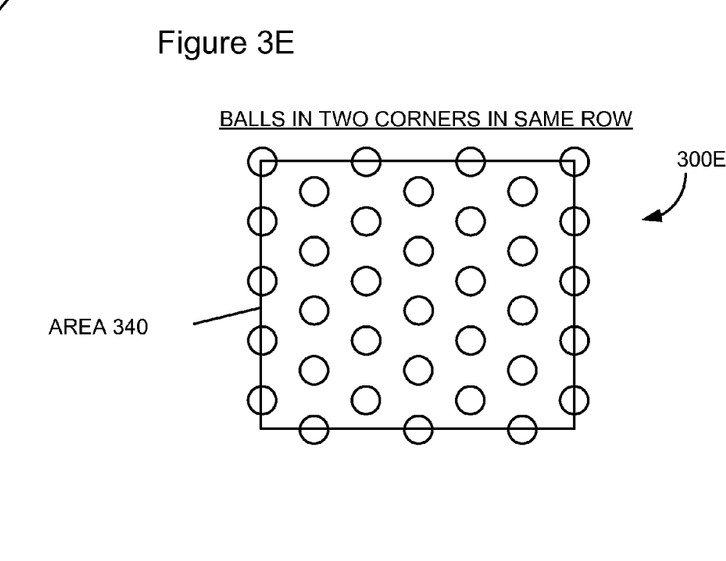

Referring to FIG. 3E, a non-orthogonal ball grid array 300E can include 35 connection balls within an area 340 available for placement of the non-orthogonal ball grid array 300E. The non-orthogonal ball grid array 300E can be configured with an edge orientation having two connection balls in corners of a common row. A selection of this edge orientation can be made based on the dimensions of the area 340 and a number of connection balls to be placed in the area 340. In some embodiments, a selection of which corners are populated with connections balls in this edge configuration can be based on a placement of routing traces between the connection balls, and/or any electrical interference that those routing traces may experience over portions of the area 340. Due to the asymmetries of the edge orientations found in the ball configurations shown in FIGS. 3C, 3D, and 3E, in some embodiments, a best fit may be achieved through combinations of rotation of such a ball configuration along with mirroring across one or both of the X and Y axes.

Figures 3F, 3G:
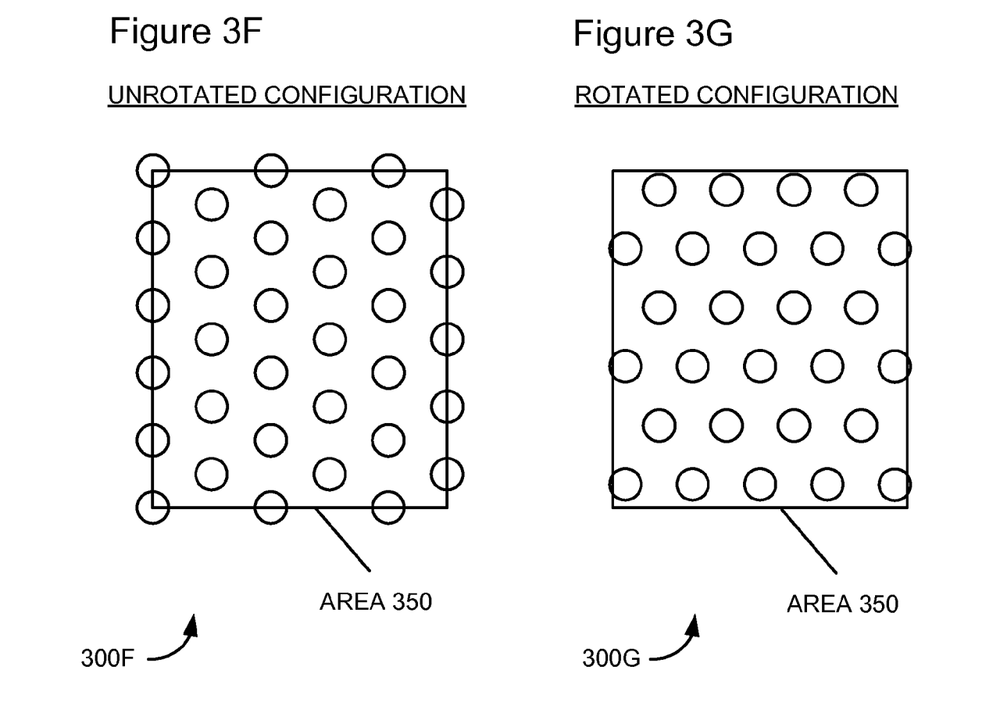
Figure 3H:
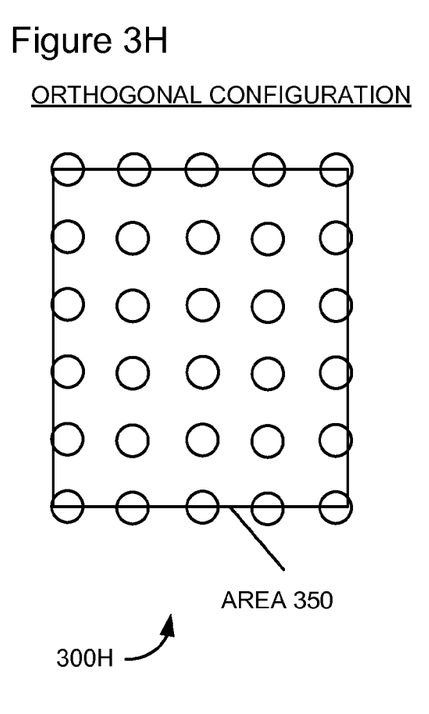

Referring to FIGS. 3F-3H, an area 350 can be available for placement of multiple connection balls. As shown in these exemplary drawings, the area 350 has dimensions of approximately 5×R in the vertical direction and approximately $$\frac{\sqrt{3}}{2} 5 \times R (\sim 4.33 \times R)$$

in the horizontal direction. Different selections of various orientations for a ball grid array are shown in FIGS. 3F-3H. In FIG. 3F, a non-orthogonal ball grid array 300F can have a triangular configuration and include 33 connection balls centered on or within the area 350. The non-orthogonal ball grid array 300F can have a similar edge orientation as the non-orthogonal ball grid array 300D shown in FIG. 3D having two connection balls in the corners of a common column. The non-orthogonal ball grid array 300F can have an unrotated row-column configuration, similar to the row-column configuration as the non-orthogonal ball grid array 200 shown in FIG. 2.

In FIG. 3G, a non-orthogonal ball grid array 300G can have a rotated triangular configuration and include no more than 27 connection balls within the area 350. The non-orthogonal ball grid array 300G can have a row-column configuration which can be similar to a rotated version of the row-column configuration of the non-orthogonal ball grid array 200 shown in FIG. 2. By rotating the row-column format of the non-orthogonal ball grid array 300G can include 6 fewer connection balls than the non-orthogonal ball grid array 300F shown in FIG. 3F. This reduction in connection balls can be attributed to the dimensions of the area 350 and based on the differences between the column and row spacing as described above with reference to FIG. 2.

A selection between the non-orthogonal ball grid array 300F and the rotated non-orthogonal ball grid array 300G can be made based on a number of connection balls to be included in the area 350 to support electrical connections to signals of the electronic system 100 and, possibly, based on a stress that may be exerted on the connection balls placed in the area 350. For example, when the design of electronic system 100 utilizes more than 27 connection balls, the non-orthogonal ball grid array 300F can be selected. When the electronic system 100 utilizes 27 connection balls or fewer a selection between the non-orthogonal ball grid array 300F and the non-orthogonal ball grid array 300G can be made based on an ability to reduce stress exerted on the connection balls when placed in the area 350, placement of routing traces between the connection balls, and/or any interference that the routing traces may experience during operation of the electronic system 100.

In FIG. 3H, an orthogonal ball grid array 300H can have a conventional 90 degree row-column format and include 30 connection balls within the area 350. Since the orthogonal ball grid array 300H has an inherently less dense ball structure than the triangular configuration described in FIG. 2, when implemented at a same ball pitch, the non-orthogonal ball grid array 300F can have a greater connection ball density than the orthogonal ball grid array 300H.

Figure 4:
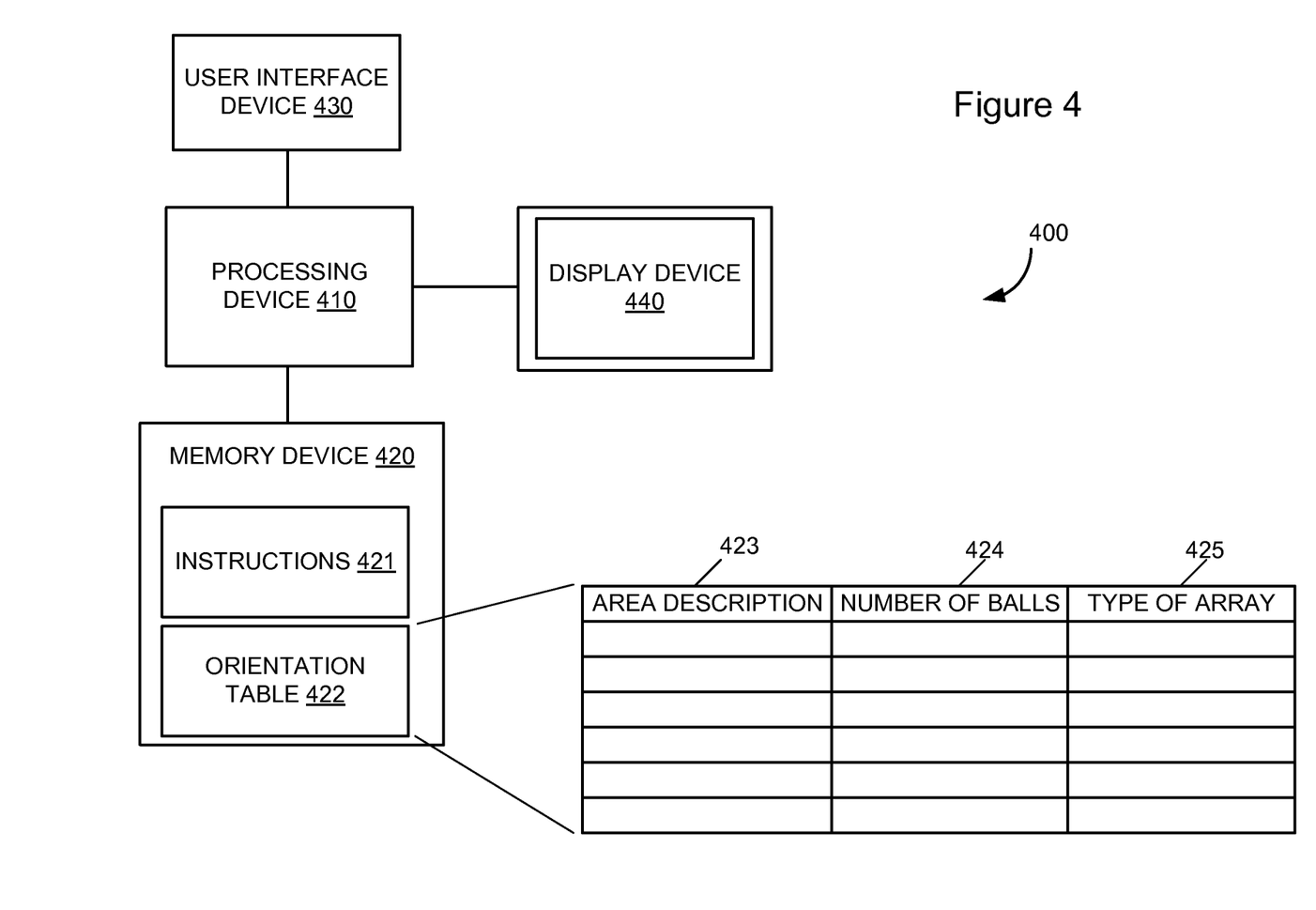
FIG. 4 is a block diagram of an apparatus to design a ball grid array.

FIG. 4 is a block diagram of an apparatus 400 to design a ball grid array. Referring to FIG. 4, the apparatus 400 can include a processing device 410 to execute instructions 421 from a memory device 420 to perform various operations including selecting a configuration of ball grid array, such as an orthogonal configuration, a non-orthogonal configuration, and an orientation for the ball grid array, such as an edge configuration and/or a rotational orientation of the selected ball grid array.

The apparatus 400 can include a user interface device 430, such as a mouse, keyboard, touch screen, stylus, microphone, speaker, or any other device that allows a user to communicate with the apparatus 400. The apparatus 400 can include a display device 440 to present information to the user of the apparatus 400, such as the selected ball grid array, an orientation of the ball grid array, and/or various options for a ball grid array. The user interface device 430 and the display device 440 can allow the processing device 410 the ability to identify one or more ball grid array configurations for an electronic system and, optionally, to select at least one of the identified ball grid arrays.

The memory device 420 can include an orientation table 422 that can be populated with various fields, such as a type of array field 425 to identify types of ball grid arrays available for placement on an electronic system. The types of array field 425 can identify an orthogonal ball grid array or a non-orthogonal ball grid array, and can identify an orientation of the orthogonal or non-orthogonal ball grid array, such as a rotational orientation and an edge orientation of the rotated orthogonal or the non-orthogonal ball grid array. The rotational orientation can identify how the ball grid array can best fit into an area of a substrate. For example, since the rows and columns of the non-orthogonal ball grid array can have differing spacing, the rotational orientation can indicate which of the lines of connection balls can be rows, and which of the lines can be columns. The edge orientation can identify a configuration of the connection balls at the edges of the ball grid array and/or the edge of the area on the substrate available for placement of the ball grid array.

The types of array field 425 can be indexed by an area description field 423 and a number of balls field 424. In some embodiments, the area description field 423 can identify a total area available for placement of a ball grid array, a shape of the area, such as square, rectangular, triangular, or the like, and/or dimensions of the area. The number of balls field 424 can identify a number of connection balls that are to be placed on the electronic system 100 to allow access to the signals of that system.

The processing device 410 can receive the description of the area available for placement of a ball grid array and a number of balls to be included in the ball grid array, for example, from the user interface device 430, and utilize the orientation table 422 to identify one or more ball grid arrays available for placement on the electronic system 100 from the type of array field 425 based on the description of the area and the number of balls to be included in the ball grid array. In some embodiments, the processing device 410 can compare the description of the area and the number of balls to be included in the ball grid array to the area description field 423 and the number of balls field 424 to identify the one or more ball grid arrays available for placement on the electronic from the type of array field 425.

Figure 5:
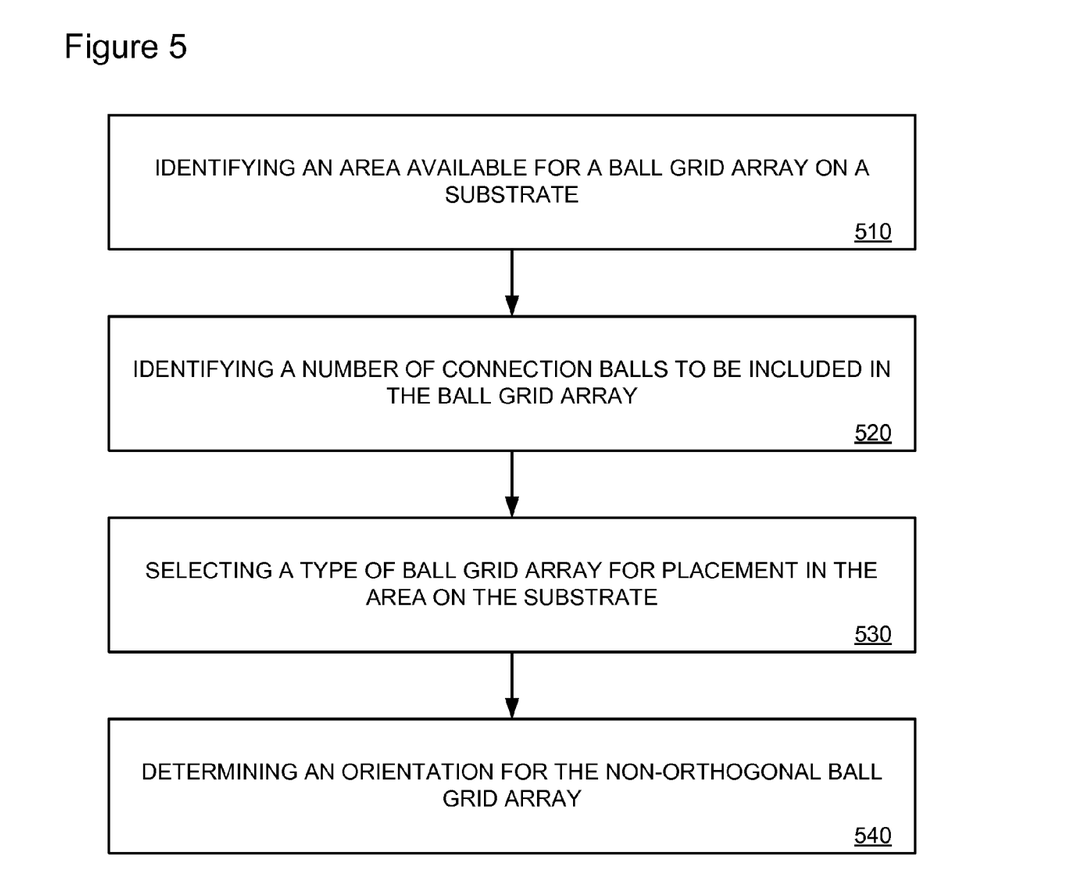
FIG. 5 is an example flowchart for the design of the non-orthogonal ball grid array for the electronic system shown in FIG. 1.

In some embodiments, the processing device 410 can directly calculate the number of connection balls based on the dimensions of the associated array area for each of the possible array orientations and row-column configurations with equations stored by the memory device 420. Table 1 shows an example of the equations that may be used by the processing device 410 to determine the number of balls capable of being placed for selected grid types and grid orientations:

tion of the substrate, for example, from a Graphic Data System or GDSII file description.

At a block 530, the apparatus can select one or more types of ball grid arrays meeting the conditions of blocks 510 and 520 for placement in the area on the substrate. For example, the type of ball grid array can be an orthogonal ball grid array with an orthogonal (i.e., 90-degree) row-column format, a 45-degree rotated orthogonal ball grid array, a non-orthogonal ball grid array with a triangular configuration, or a rotated non-orthogonal ball grid array with a triangular configuration. In some embodiments, other non-triangular non-orthogonal ball grid arrays types can be selected for placement in the area on the substrate.

The apparatus can identify the one or more ball grid array types based on the area available for the ball grid array on the substrate and the number of connection balls to be included in the ball grid array. In some embodiments, the apparatus can select the ball grid array type based on additional information, such as a placement of routing traces between connection balls of the ball grid array or a presence of interference with the routing traces, for example, from the core circuitry of an electronic system.

At a block 540, the apparatus can determine an orientation for the 45-degree rotated orthogonal and non-orthogonal ball grid arrays. The apparatus can determine the orientation of the ball grid array based, at least in part, on the area available for the ball grid array on the substrate and possibly the number of connection balls to be included in the ball grid array.

The orientation of the 45-degree rotated orthogonal and non-orthogonal ball grid arrays can include a rotational orientation, a mirror orientation, and/or an edge orientation of the ball grid array. The rotational orientation can identify how the ball grid array can be rotated to fit in an area of a substrate. For example, since the rows and columns of the

TABLE 1

| Grid | Edge Orientation | Number of Balls | Notes |
|---|---|---|---|
| Orthogonal | Standard | Rows × Columns (R * C) | |
| Orthogonal | No Balls in Corners | ((R − 1) * (C + 1) + (R − 1) * (C + 1))/4 | R and C are odd numbers |
| Orthogonal | Balls in All Corners | ((R + 1) * (C + 1) + (R − 1) * (C − 1))/4 | R and C are odd numbers |
| Orthogonal | Balls in Opposite Corners | R * C/2 | R and C are even numbers |
| Orthogonal | Balls in Corners Same Column | ((R + 1) * C + (R − 1) * C)/4 | R is odd and C is even |
| Orthogonal | Balls in Corners Same Row | ((C + 1) * R + (R − 1) * C)/4 | R is even and C is odd |
| Non-Orthogonal | No Balls in Corners | ((R − 1) * (C + 1) + (R − 1) * (C + 1))/4 | R and C are odd numbers |
| Non-Orthogonal | Balls in All Corners | ((R + 1) * (C + 1) + (R − 1) * (C − 1))/4 | R and C are odd numbers |
| Non-Orthogonal | Balls in Opposite Corners | R * C/2 | R and C are even numbers |
| Non-Orthogonal | Balls in Corners Same Column | ((R + 1) * C + (R − 1) * C)/4 | R is odd and C is even |
| Non-Orthogonal | Balls in Corners Same Row | ((C + 1) * R + (R − 1) * C)/4 | R is even and C is odd |

FIG. 5 is an example flowchart for the design of a ball grid array for an electronic system. Referring to FIG. 5, at block 510, an apparatus can identify an area available for a ball grid array on a substrate. In some embodiments, the area can be determined based on a user input, for example, from a user interface device 430, or the area can be automatically identified by the apparatus based on a schematic or mechanical description of the substrate and/or corresponding core circuitry.

At block 520, the apparatus can identify a number of connection balls to be included in the ball grid array. In some embodiments, the number of connection balls to be included in the ball grid array can be determined based on a user input, for example, from a user interface device 430, or the number of connection balls to be included in the ball grid array can be automatically identified by the apparatus based on a schematic of the core circuitry or mechanical descripnon-orthogonal ball grid array can have differing spacing, the rotational orientation can indicate which of the lines of connection balls can be rows, and which of the lines can be columns. The edge orientation can identify a configuration of the connection balls at the edges of the ball grid array and/or the edge of the area on the substrate available for placement of the ball grid array, for example, shown in FIGS. 3A-3G.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

What is claimed is:

1. A method comprising:
    identifying, with a processing device, an area available for a contact grid array on a substrate;
    determining, with the processing device, an orientation for the contact grid array including a non-orthogonal row-column format with multiple connection elements arranged in a hexagonal configuration, wherein the determined orientation includes at least a rotational orientation which is determined based, at least in part, on the area available for the contact grid array on the substrate and a required number of the connection elements in the area available; and
    implementing the determined orientation on the contact grid array.

2. The method of claim 1, wherein determining the orientation for the contact grid array further comprises determining, with the processing device, an arrangement of connection elements on edges of the area available for the contact grid array on the substrate based, at least in part, on dimensions of the area available for the contact grid array on the substrate and a number of connection elements in the contact grid array.

3. The method of claim 1, wherein a distance between rows is different than a distance between columns of the contact grid array, and wherein determining the rotational orientation of the contact grid array is further based on the dimensions of the area available for the contact grid array with respect to the distance between rows and the distance between columns of the contact grid array.

4. The method of claim 3, wherein the distance between the rows and the distance between the columns are both less than a preset distance between the connection elements.

5. The method of claim 1, wherein the orientation of the contact grid array is based, at least in part, on a distance of the connection elements from a center of the area available for the contact grid array on the substrate.

6. The method of claim 1, further comprising determining, with the processing device, locations for routing traces between the connection elements to electrically couple circuitry disposed on the substrate to the contact grid array, wherein determining the orientation for the contact grid array is based, at least in part, on the locations for the routing traces.

7. The method of claim 6, wherein the routing traces include at least one of a signaling trace, a power trace, or a ground trace.

8. An apparatus, including:
    a contact grid array; and
    a memory device storing instructions configured to cause a processing device to perform operations comprising:
    identifying an area available for the contact grid array on a substrate; and
    determining an orientation for the contact grid array having a non-orthogonal row-column format with multiple connection elements arranged in a hexagonal configuration wherein the determined orientation includes at least a rotational orientation which is determined based, at least in part, on the area available for the contact grid array on the substrate and a required and a required of the connection elements in the area available.

9. The apparatus of claim 8, wherein determining the orientation for the contact grid array further comprises determining an arrangement of connection elements on edges of the area available for the contact grid array on the substrate based, at least in part, on dimensions of the area available for the contact grid array on the substrate and a number of connection elements in the contact grid array.

10. The apparatus of claim 8, wherein a distance between rows is different than a distance between columns of the contact grid array, and wherein determining the rotational orientation of the contact grid array further based on the dimensions of the area available for the contact grid array with respect to the distance between rows and the distance between columns of the contact grid array.

11. The apparatus of claim 10, wherein the distance between the rows and the distance between the columns are both less than a preset distance between the connection elements.

12. The apparatus of claim 8, wherein the orientation of the contact grid array is based, at least in part, on a distance of the connection elements from a center of the area available for the contact grid array on the substrate.

13. The apparatus of claim 8, wherein the instructions are configured to cause the processing device to perform operations further comprising determining locations for routing traces between the connection elements to electrically couple circuitry disposed on the substrate to the grid ball array, wherein determining the orientation for the contact grid array is based, at least in part, on the locations for the routing traces.

14. An apparatus comprising:
a contact grid array disposed on a substrate in a non-orthogonal row-column format with connection elements arranged in a hexagonal configuration, wherein the contact grid array has an orientation which at least includes a rotational orientation, and wherein the rotational orientation is determined based, at least in part, on an area available for the contact grid array on the substrate and a required number of the connection elements in the area available.

15. The apparatus of claim 14, wherein the orientation of the contact grid array includes an arrangement of connection elements on edges of the area available for the contact grid array on the substrate that is based, at least in part, on dimensions of the area available for the contact grid array on the substrate and a number of connection elements in the contact grid array.

16. The apparatus of claim 14, wherein a distance between rows is different than a distance between columns of the contact grid array, and wherein a rotational orientation of the contact grid array is further determined based on the dimensions of the area available for the contact grid array with respect to the distance between rows and the distance between columns of the contact grid array.

17. The apparatus of claim 16, wherein the distance between the rows and the distance between the columns are both less than a preset distance between the connection elements.

18. The apparatus of claim 14, wherein the orientation of the contact grid array is based, at least in part, on a distance of the connection elements from a center of the area available for the contact grid array on the substrate.

19. The apparatus of claim 14, further comprising routing traces located between the connection elements and configured to electrically couple circuitry disposed on the substrate to the grid ball array.

20. The apparatus of claim 19, wherein the routing traces include at least one of a signaling trace, a power trace, or a ground trace.

* * * * *